United States Patent [19]
Tansley

[11] 3,992,639
[45] Nov. 16, 1976

[54] SCANNING DEVICE

[75] Inventor: Trevor Lionel Tansley, Hempshill Vale, England

[73] Assignee: U.S. Philips Corporation, New York, N.Y.

[22] Filed: May 13, 1975

[21] Appl. No.: 577,112

[30] Foreign Application Priority Data
May 29, 1974 United Kingdom............ 23860/74

[52] U.S. Cl. .......................... 307/304; 307/221 D; 307/251; 357/23; 357/42
[51] Int. Cl.² ............... H03K 17/60; G11C 27/00; H03K 3/353; H01L 29/78
[58] Field of Search ............ 307/221 C, 221 D, 251, 307/304; 357/23, 24, 42; 328/132

[56] References Cited
UNITED STATES PATENTS

| | | | |
|---|---|---|---|
| 3,111,556 | 11/1963 | Knoll et al. .................. | 357/24 X |
| 3,378,688 | 4/1968 | Kabell ........................... | 357/23 X |
| 3,397,325 | 8/1968 | Weimer ......................... | 357/42 X |
| 3,575,610 | 4/1971 | Okubo ........................... | 307/304 X |
| 3,763,379 | 10/1973 | Ashikawa et al. ............. | 307/304 X |
| 3,775,623 | 11/1973 | Kamiyama et al. ............ | 357/24 X |
| 3,801,883 | 4/1974 | Tiemann ........................ | 357/24 X |

OTHER PUBLICATIONS

Ando et al. "New Solid-State Image Scanner Capable of Random-Positioning;"NEC Research & Development, No. 27 (10/1972), pp. 22–26.

Primary Examiner—John S. Heyman
Assistant Examiner—Larry N. Anagnos
Attorney, Agent, or Firm—Frank R. Trifari; Leon Nigohosian

[57] ABSTRACT

A line scanner comprising an array of CMOS pairs having a common resistive gate. The gate provides a potential gradient along the array in response to a potential difference across its ends, so that the CMOS pairs can receive a gating voltage in sequence when such potential difference undergoes a progressive change in magnitude.

6 Claims, 7 Drawing Figures

SCANNING DEVICE

The invention relates to a scanning device comprising an input gate and a number of output gates which are each destined to feed an associated load, in which the input gate can be connected electrically to each of the output gates by means of a series of switches each comprising an insulated gate field effect transistor by means of which an electric connection can be obtained between the input gate and an associated output gate, the gate electrodes of the field effect transistors being connected together electrically by means of a resistance element by means of which potential differences can be applied mutually between the gate electrodes of the field effect transistors by applying a potential gradient across the resistance element.

Such devices are known in particular in the form of monolithic integrated circuits. The field effect transistors are usually present beside each other in a row in that sense that the direction of current of the transistor extends approximately transversely to the longitudinal direction of the row. In such known devices the resistance element usually consists of a resistance layer deposited on an insulating layer covering the surface of the body, extends parallel to the row across the insulating layer and is present above the transistor and hence also constitutes the gate electrodes of the field effect transistors. A potential drop can be applied across the resistance element as a result of which a number of field effect transistors are in the on-condition while the remaining field effect transistors of the row are in the off-condition. By controlling the voltage and/or the voltage drop across the resistance element, the output gates can be addressed in a controllable manner.

The simple scanning device described suffers from the drawback that the output gates cannot be addressed selectively. The voltage applied to the resistance element usually determines only the number of transistors which are on. A small variation in the voltage of the resistance layer results only in a variation of the number of output gates which are addressed at a given instant. This means that during operation several output gates are often, or even in most of the cases, addressed simultaneously. Although this need not always be a drawback, a scanning device is nevertheless preferably used for many applications in which it is possible to select the output gates individually.

For that purpose, a known monolithic integrated scanning device comprises between the input gate and the output gates each time two series-connected insulated gate field effect transistors.

The pairs of transistors constitute two parallel rows of transistors. Above the rows of transistors are provided two parallel strip-shaped resistance elements which form the gate electrodes of the transistors in each row. By applying across said resistance elements, for example, equal potential drops which however, are in opposite directions, it is possible to select at any instant of all the transistor pairs only one, of which the two transistors are on and hence to address the output gate associated with said transistor pair.

However, these known scanning circuits also suffer from a number of drawbacks. For example, the presence of two resistance elements across which opposite voltage gradients are applied involves the use of several voltage sources. In addition, the voltages to be applied to the resistance elements should be accurately matched to each other. In an integrated form, such devices occupy comparatively much space as a result of which, in particular when the number of output gates is large, the manufacture thereof may be additionally impeded. A further drawback is that due to the presence of two resistance elements the energy dissipation in the device may be increased.

It is therefore an object of the invention to provide a scanning circuit in which the output gates can each individually be addressed and which nevertheless comprises a simple construction having only a single resistance element.

Therefore, a scanning circuit arrangement of the kind mentioned in the preamble is characterized according to the invention in that the switches between the input gate and the output gates each comprise a pair of insulated gate field effect transistors, which transistors are of the complementary type with respect to each other and constitute a series arrangement between the input gate and the associated output gate, the pairs of gate electrodes of the complementary transistors of each transistor pair being connected at mutual distances to the resistance elements.

As will become apparent from the description of the figures hereinafter, the electric characteristics of the complementary field effect transistors of each pair can be adapted in such manner and/or be connected to the resistance element via their gate electrodes in such manner that both transistors of each pair are on simultaneously in a restricted voltage range of voltages to be applied to the resistance element. As a result of this it is possible to address the output gates one by one by means of only one single resistance element.

The complementary transistors of the series of switches are preferably provided between the input gate and the output gates in a common semiconductor body and at a surface of said body and constitute, together with the resistance element, a monolithic integrated circuit.

The invention will now be described in greater detail with reference to an embodiment and the accompanying diagrammatic drawing, in which.

Figure 1:
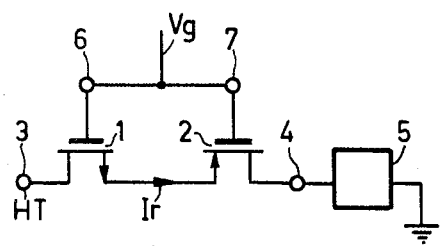
FIG. 1 shows a circuit of a complementary insulated gate field-effect transistor pair.

Referring to the drawings, the circuit of the complementary insulated gate field-effect transistor pair shown in FIG. 1 comprises an n-type channel transistor 1 and a p-type channel transistor 2 of the depletion type. These two transistors 1 and 2 have their source electrodes connected together. The drain electrode of the transistor 1 is connected to an input terminal 3 and the drain electrode of the transistor 2 is connected to an output terminal 4. With a supply voltage (HT) connected to the terminal 3 and a load 5 connected between a reference voltage, for example earth and the output terminal 4, the complementary transistor pair may be considered as a switch with the input terminal 3 being an input port or gate and the output terminal 4 being an output port or gate which are interconnected, when the switch is closed, to feed current to the load 5.

Figure 2:
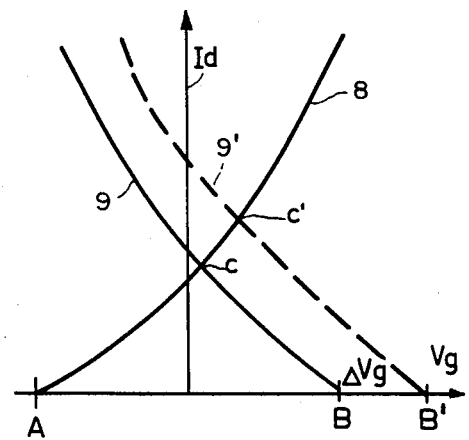
FIG. 2 shows gating voltage/drain current curves for the transistor pair of FIG. 1.

The current flows through the series connection composed of the source-to-drain current paths of the two transistors 1 and 2 is thus controlled in accordance with a gating voltage Vg applied to the insulated gate electrodes 6 and 7 of the two transistors. The transistor 1 has a gating voltage Vg/drain current Id characteristic represented by the curve 8 in FIG. 2, whereas the transistor 2 has a gating voltage Vg/drain current Id characteristic represented by the curve 9 in FIG. 2. Thus, when the gating voltage Vg is applied to the two gate electrodes 6 and 7, as indicated in FIG. 1, a current Ir can flow through the transistors 1 and 2 only when this gating voltage Vg has a magnitude between the peaks A and B in FIG. 2. As a result, a ramped gating voltage Vg starting with a magnitude Vg = A and ending with a magnitude Vg = B will produce across the load 5 a voltage pulse having a duration which depends upon the slope of the ramped gating voltage Vg.

Figure 3:
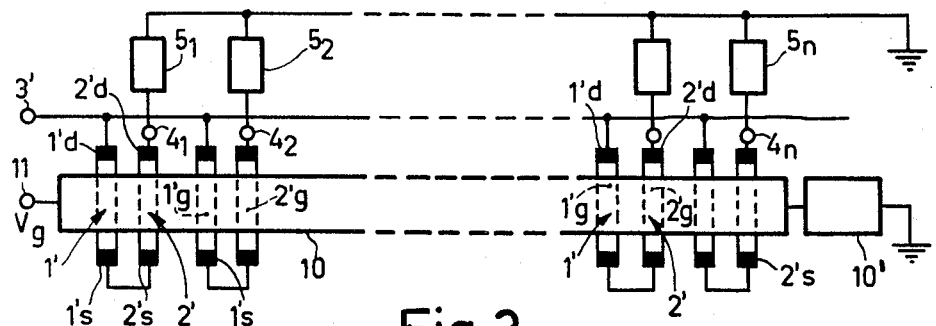
FIG. 3 shows diagrammatically a scanning circuit arrangement according to the invention.

Consider now, as illustrated in FIG. 3, a series of such complementary transistor pairs which are connected between a common input terminal (port or gate) 3' and output terminals (ports or gate) $4_1$ to $4_n$ for feeding respective loads $5_1$ to $5_n$. A gating voltage Vg is applied to the gate electrodes of each transistor pair via a resistive element which is represented by the elongate rectangle 10. The two transistors of each pair are represented by the rectangles 1' and 2', their respective source electrodes are represented by the shaded portions 1's and 2's, their drain electrodes are represented by the shaded portions 1'd and 2'd and so on. The gate electrodes 1'g and 2'g, respectively, and so on of the respective transistors are shown in broken lines. This method of representation of the resistive element and of the transistor pairs has been chosen because it is thought to be compatible with the realisation of the scanning circuit arrangement as an integrated circuit, in accordance with a preferred embodiment of the invention, in which the resistive element 10 constitutes a single common gating electrode for the series of transistor pairs. The resistive element 10 provides a distributed resistance along which the gates 1'g and 2'g of the transistor pairs are connected in spaced relationship. The resistor 10 is connected between earth and a gating voltage control terminal 11 in series with an element 10'. Thus, a gating voltage Vg applied to the control terminal 11 will produce a potential gradient along the resistive element 10.

Figure 4:
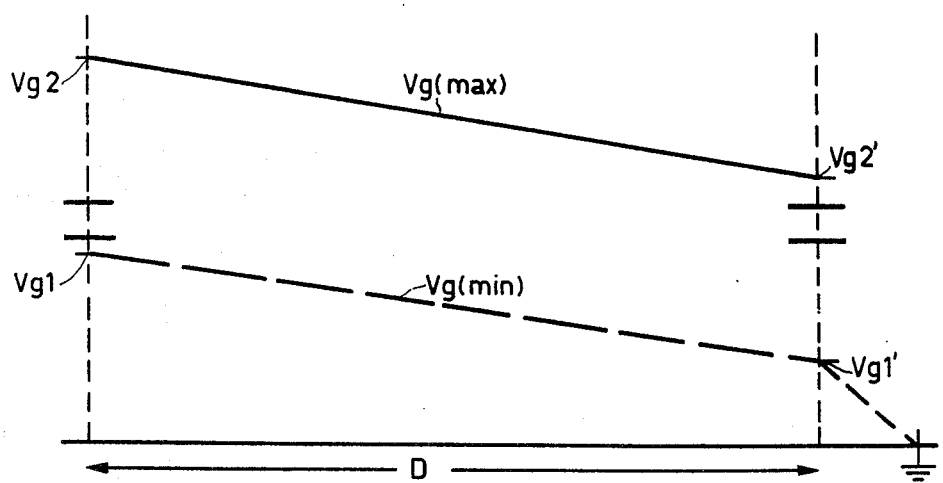
FIG. 4 illustrates the potential gradient along the resistive element of the arrangement of FIG. 3.

If, as illustrated in FIG. 4, the gating voltage Vg at the control terminal 11 varies between a minimum Vg1 and a maximum Vg2, then due to the potential gradient said voltage will vary between a minimum Vg1' and a maximum Vg2' at the end of the resistive element 10 remote from the control terminal 11. Between the ends of the resistive element 10, the potential will show intermediate maxima and minima, as represented by the lines Vg (max) and Vg (min). As the gating voltage Vg applied at the control terminal 11 changes from its minimum to maximum magnitudes, the potential at each of the pairs of gates 1'g and 2'g of the transistor pairs passes through the voltage range A to B (FIG. 2) in sequence along the resistive element 10. As a consequence, the transistor pairs are switched on and off sequentially along the series. Therefore, if the gating voltage Vg is an a.c. signal, the transistor pairs will be switched on and off sequentially with the same frequency of this a.c. signal.

In practice, the maximum current available through each transistor pair for feeding the associated load will be small. The maximum current is given in FIG. 2 by cross-over point C between the curves 8 and 9. However, the gating voltage magnitudes A and B are, in fact, artificially separated further apart, this occurring inherently as a consequence of the distributed resistance of the resistive element 10 and of the finite separation of the gates 1'g and 2'g of each transistor pair. Therefore, the maximum current although still small, is in fact at the cross-over point C' of the curve 8' and the curve 9, due to the difference Δ Vg of the gating voltage for the two gates of each transistor pair. Thus, the operative gating voltage magnitudes become A and B'.

Instead of a linear scanning circuit a plurality scanning circuit arrangement according to the invention can be employed to perform line scans in a solid state display device in which the "loads" for each arrangement feed an array of emissive elements, (e.g. photoemitters) possibly through a bipolar current amplification stage (e.g. an emitter follower stage). An intermediate array of insulated gate field-effect transistors with a common low resistance gate might provide the brightness signal for the emissive elements. Frame scan could then be performed by a further scanning arrangement in which the loads are the respective resistive elements of the line scan arrangements.

As an alternative application an array of insulated gate field-effect transistors may be scanned sequentially by means of a scanning circuit arrangement according to the invention of which transistors, for example, the source electrodes are connected to a photodiode array, and the drain electrodes are commoned to means to receive picture signals. The scanning arrangement can, for example, be integrated with the screen of a Si-Vidicon to obviate the use of an external electron beam.

Figure 5:
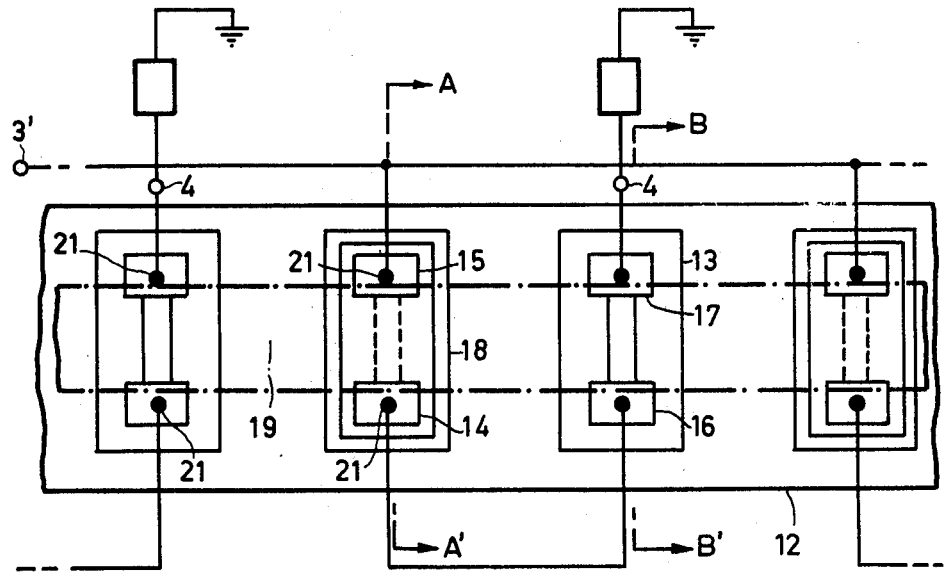
FIGS. 5, 6 and 7 show diagrammatically the realisation of a scanning circuit arrangement according to the invention in the form of an integrated circuit.
Figure 6:
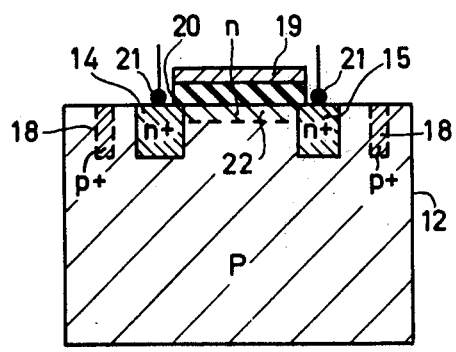
Figure 7:
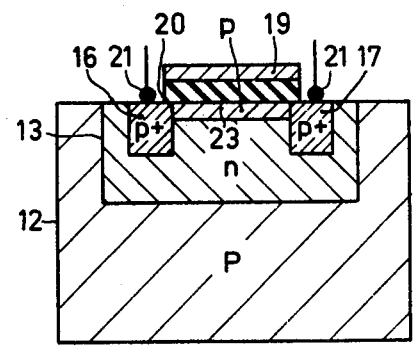

A scanning circuit arrangement according to the invention can be realised as an integrated circuit using known technologies as will now be considered with reference to FIGS. 5, 6 and 7.

FIG. 5 is a diagrammatic plan view of a part of the device, and FIGS. 6 and 7 are two sections of the device through the lines AA' and BB', respectively, in FIG. 5.

The device is formed with a series of complementary transistor pairs of which only one pair and one transistor in each adjacent pair are shown in FIG. 5. The device comprises a substrate 12 of p-type monocrystalline silicon. Each transistor pair comprises an N-channel transistor (IGFET) with insulated gate electrode which is formed directly on the substrate 12 and a P-channel IGFET which is formed on a pocket 13 of n-type material (e.g. arsenic) formed in the substrate 12 with a comparatively low doping concentration. The n-type IGFET has n-type source and drain regions 14 and 15 (e.g. of arsenic) and the P-channel IGFET has p-type source and drain regions 16 and 17 (e.g. of boron). Each of the N-channel IGFET's is surrounded by a p-type channel stopper region 18, which is suitably of boron. A common gate electrode 19 of, for example, polycrystalline silicon, forms the gate for each transistor. This common gate electrode 19 is laid down over an oxide (e.g. $SiO_2$) layer 20 which, for the sake of convenience is shown only in FIGS. 6 and 7 beneath the common gate electrode 19. For the same reason, details of metallization for inter-connections are also omitted, being symbolically represented only by contact points 21. Preferably, at least one of the transistors of each pair of transistors is of the depletion type. In the present embodiment, both transistors of each transistor pair are of the depletion type, as is shown in FIGS. 6 and 7. In the case of the N-channel IGFET, an N-channel in the form of a surface-adjoining inversion layer 22 may be obtained by means of positive charge in the oxide layer 20. The N-channel may also be formed by a shallow layer (e.g. by ion implantation) of n-type material (e.g. arsenic). In the case of the P-channel IGFET a shallow P-channel 23 can be obtained e.g. by implantation of boron ions. The connection of the drain 15 of each N-channel IGFET to the input terminal 3', the connection of the drain 17 of each P-channel IGFET to its associated output terminal 4, and the interconnection of the source regions 14 and 16 in each complementary pair of IGFET's is also shown diagrammatically in FIG. 5.

What is claimed is:
1. A scanning device comprising:
   a. an input gate and a number of output gates which are each destined to feed an associated load;
   b. a series of switches disposed between said input gate and respective said output gates, said switches electrically connecting said input gate to respective ones of said output gates and each comprising a pair of insulated gate field effect transistors that are complementary with respect to each other and are connected to each other in series arrangement between said input gate and their associated output gate, said complementary transistors comprising respective gate electrodes; and
   c. a resistance element electrically connecting said gate electrodes together via connection of each of said gate electrodes in each of said complementary transistor pairs to different pairs of position points along said resistance element such that potential differences can be applied mutually between said gate electrodes of the field effect transistors by applying a potential gradient across the resistance element.

2. A scanning device as in claim 1, wherein the respective paired said gate electrodes of said complementary transistors are connected at mutual distances to said resistance element.

3. A semiconductor device as in claim 1, suitable for use in a scanning arrangement wherein said device further comprises a semiconductor body and said complementary transistors comprising said series of switches are disposed in and at a surface of said semiconductor body and the foregoing, together with said resistance element, constitute a monolithic integrated circuit.

4. A semiconductor device as in claim 3, wherein said device comprises an insulating layer covering said semiconductor body, said resistance element being disposed on said layer in the form of a resistance layer extending parallel to said surface across the insulating layer and serving as a common gate electrode of said series of complementary field effect transistor pairs.

5. A semiconductor device as in claim 3, wherein at least the field effect transistors of a certain polarity are of the depletion type.

6. A semiconductor device as in claim 5, wherein all of said transistors of said series of switches are of the depletion type.

* * * * *